(12) United States Patent
Li et al.

(10) Patent No.: US 10,867,156 B2
(45) Date of Patent: Dec. 15, 2020

(54) DISPLAY SUBSTRATE, FINGERPRINT IDENTIFICATION PANEL, FINGERPRINT IDENTIFICATION METHOD AND DISPLAY DEVICE

(71) Applicant: BOE TECHNOLOGY GROUP CO., LTD., Beijing (CN)

(72) Inventors: Changfeng Li, Beijing (CN); Xue Dong, Beijing (CN); Haisheng Wang, Beijing (CN); Xiaochuan Chen, Beijing (CN); Yingming Liu, Beijing (CN); Lei Wang, Beijing (CN); Xiaoliang Ding, Beijing (CN); Xiaoquan Hai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/224,907

(22) Filed: Dec. 19, 2018

(65) Prior Publication Data

US 2019/0354740 A1 Nov. 21, 2019

(30) Foreign Application Priority Data

May 17, 2018 (CN) .......................... 2018 1 0476374

(51) Int. Cl.
*G06K 9/00* (2006.01)
*G09G 3/3258* (2016.01)
*H01L 51/52* (2006.01)
*G02B 27/30* (2006.01)
*H01L 27/12* (2006.01)
*H01L 27/32* (2006.01)

(52) U.S. Cl.
CPC .......... *G06K 9/0004* (2013.01); *G02B 27/30* (2013.01); *G09G 3/3258* (2013.01); *H01L 27/1214* (2013.01); *H01L 27/3246* (2013.01); *H01L 51/5206* (2013.01); *H01L 51/5221* (2013.01); *H01L 51/5237* (2013.01)

(58) Field of Classification Search
CPC .... G06K 9/0004; G02B 27/30; G09G 3/3258; H01L 27/1214; H01L 27/3246; H01L 51/5206; H01L 51/5221; H01L 51/5237
See application file for complete search history.

(56) References Cited

U.S. PATENT DOCUMENTS

| | | | | |
|---|---|---|---|---|
| 2012/0061675 A1* | 3/2012 | Yamamoto | .......... | H01L 27/1214 257/59 |
| 2014/0183479 A1* | 7/2014 | Park | .......... | H01L 51/56 257/40 |
| 2016/0067931 A1* | 3/2016 | Yang | .......... | G02B 6/0053 428/156 |
| 2017/0033173 A1* | 2/2017 | Kim | .......... | G09G 3/3225 |
| 2017/0220838 A1* | 8/2017 | He | .......... | G06F 3/0418 |
| 2017/0345845 A1* | 11/2017 | Wu | .......... | G09G 3/3677 |
| 2018/0019288 A1* | 1/2018 | Yang | .......... | H01L 27/3227 |

* cited by examiner

*Primary Examiner* — Stephen G Sherman
(74) *Attorney, Agent, or Firm* — Brooks Kushman P C.

(57) ABSTRACT

A display substrate, a fingerprint identification panel, a fingerprint identification method and a display device are provided. The display substrate includes a first metal pattern and a second metal pattern arranged on a base substrate and in different layers. An orthographic projection of the first metal pattern on the base substrate at least partially overlaps with an orthographic projection of the second metal pattern on the base substrate, and one of the first metal pattern and the second metal pattern is a supply voltage signal line.

11 Claims, 3 Drawing Sheets

DISPLAY SUBSTRATE, FINGERPRINT IDENTIFICATION PANEL, FINGERPRINT IDENTIFICATION METHOD AND DISPLAY DEVICE

CROSS-REFERENCE TO RELATED APPLICATION

This application claims priority to Chinese Patent Application No. 201810476374.9 filed on May 17, 2018, which is incorporated herein by reference in its entirety.

TECHNICAL FIELD

The present disclosure relates to the field of display, in particular to a display substrate, a fingerprint identification panel, a fingerprint identification method and a display device.

BACKGROUND

A fingerprint identification panel in the related art generally includes a display substrate and a fingerprint identification module. During the fingerprint identification process, the light irradiated onto the fingerprint is reflected by a fingerprint of a user's finger, the reflected light is transmitted through the display substrate and received by the fingerprint identification module, and the fingerprint is identified by the fingerprint identification module according to the received light.

There are many metal patterns such as various signal lines on the existing display substrate in the related art. Since the metal patterns are opaque, the light may be blocked by the metal patterns, which may result in a low transmittance of the display substrate. In a case that the display substrate is applied to the fingerprint identification, the information about the light reflected by a valley and ridge of the fingerprint is in a great loss, thereby adversely affecting the precision of the fingerprint identification.

SUMMARY

In a first aspect, a display substrate is provided according to some embodiments of the present disclosure, which includes a first metal pattern and a second metal pattern arranged on a base substrate and in different layers, an orthographic projection of the first metal pattern on the base substrate at least partially overlaps with an orthographic projection of the second metal pattern on the base substrate, and one of the first metal pattern and the second metal pattern is a supply voltage signal line.

In some optional embodiments, an extending direction of the first metal pattern is the same as that of the second metal pattern.

In some optional embodiments, the first metal pattern and the second metal pattern extend in a row direction; or the first metal pattern and the second metal pattern extend in a column direction.

In some optional embodiments, the orthographic projection of the first metal pattern on the base substrate falls within the orthographic projection of the second metal pattern on the base substrate.

In some optional embodiments, the first metal pattern is the supply voltage signal line, and the second metal pattern is a data line; or the second metal pattern is the supply voltage signal line, and the first metal pattern is a data line.

In some optional embodiments, the display substrate further includes:
a thin film transistor and the data line arranged on the base substrate, a source electrode of the thin film transistor being connected to the data line;
a passivation layer covering the thin film transistor and the data line; and
the supply voltage signal line and a conductive connection line arranged on the passivation layer, the conductive connection line being connected to a drain electrode of the thin film transistor through a first via hole penetrating the passivation layer.

In some optional embodiments, the display substrate is an OLED (Organic Light Emitting Diode) display substrate, and the OLED display substrate further includes:
a planarization layer covering the supply voltage signal line and the conductive connection line;
an anode arranged on the planarization layer, the anode being connected to the conductive connection line through a second via hole penetrating the planarization layer;
a pixel defining layer arranged on the anode;
an organic light emitting layer arranged in a defined region of the pixel defining layer; and
a cathode arranged on the organic light emitting layer, where the anode and the cathode each is made of a light-transmitting material.

In some optional embodiments, the conductive connection line and the supply voltage signal line are made of a same material and formed in a single patterning process.

In some optional embodiments, the first metal pattern includes a plurality of first metal blocks having a same length, and the plurality of first metal blocks is arranged at equal intervals on the base substrate, and a light-transmitting region is formed between every two adjacent of the plurality of first metal blocks.

In some optional embodiments, the orthographic projection of the second metal pattern on the base substrate falls within the orthographic projection of the first metal pattern on the base substrate. The second metal pattern includes a plurality of second metal blocks having the same length, and the plurality of second metal blocks is arranged at equal intervals on the base substrate, and a light-transmitting region is formed between every two adjacent of the plurality of second metal blocks.

In a second aspect, a fingerprint identification panel is further provided according to some embodiments of the present disclosure, which includes the display substrate described above and a fingerprint identification module arranged on a non-display side of the display substrate.

In some optional embodiments, the fingerprint identification module includes a collimating film and photosensitive sensors, the collimating film is configured to transmit light reflected by a fingerprint and filter out scattered light in the reflected light to cause the transmitted light through the collimating film to become the collimated light, and each of the photosensitive sensors is configured to receive the collimated light transmitted through the collimating film and identify the fingerprint according to the collimated light.

In some optional embodiments, the display substrate is a flexible display substrate, and the collimating film is used as the base substrate of the display substrate.

In some optional embodiments, the collimating film includes a plurality of vertical light-blocking walls equally spaced, and a transparent material layer filling between every two adjacent of the light-blocking walls.

In a third aspect, a fingerprint identification method is further provided according to embodiments of the present disclosure, which is applied to the fingerprint identification panel described above. The fingerprint identification method includes:

receiving, by the fingerprint identification module, light that is transmitted through the display substrate and then is reflected by a fingerprint; and identifying, by the fingerprint identification module, the fingerprint according to the received light.

In some optional embodiments, the fingerprint identification module includes a collimating film and photosensitive sensors, the collimating film is configured to transmit light reflected by the fingerprint and filter out scattered light in the reflected light to cause the transmitted light through the collimating film to become the collimated light, and each of the photosensitive sensors is configured to receive the collimated light transmitted through the collimating film and identify the fingerprint according to the collimated light. The receiving, by the fingerprint identification module, light reflected by a fingerprint includes:

enabling the light reflected by the fingerprint to transmit through the collimating film to become the collimated light, and receiving, by the photosensitive sensors, the collimated light transmitted through the collimating film.

In a fourth aspect, a display device is further provided according to some embodiments of the present disclosure, which includes the fingerprint identification panel described above.

DETAILED DESCRIPTION

To make a technical problem to be solved, technical solutions and advantages in embodiments of the present disclosure clearer, the present disclosure is described in details in conjunction with the drawings and particular embodiments below.

Figure 1:
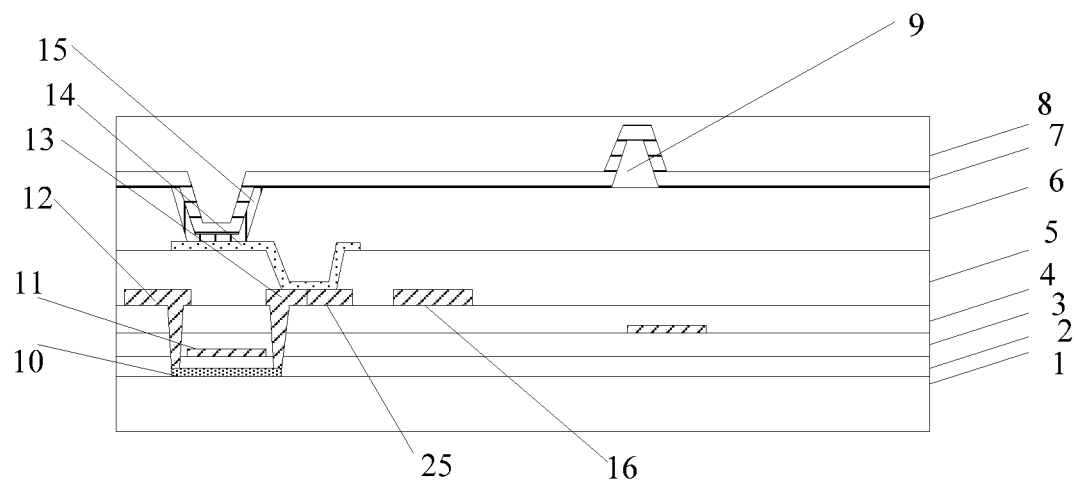
FIG. 1 is a schematic diagram of an OLED display substrate in the related art.

As shown in FIG. 1, the OLED display substrate in the related art includes: a base substrate 1, an interlayer insulating layer 4, a planarization layer 5, a pixel defining layer 6, a thin film encapsulating layer 8, a spacer 9, a thin film transistor, a light emitting unit, and a data line. The thin film transistor includes a gate electrode 11, a first gate insulating layer 2, a second gate insulating layer 3, an active layer 10, a source electrode 12, and a drain electrode 13. The data line is arranged in the same layer and is made of the same material as those of the source electrode 12 and the drain electrode 13. The light emitting unit includes an anode 14, an organic light emitting layer 15, and a cathode 7. The OLED display substrate further includes a VDD signal line 16 arranged in the same layer with the same material as those of the source electrode 12, the drain electrode 13 and the data line. The data line and the VDD signal line 16 are generally made of metal, which are opaque and may block the light, and thus the OLED display substrate has a low transmittance.

In a case that the OLED display substrate is applied into the fingerprint identification, information about light reflected by the valley and ridge of the fingerprint is transmitted to a fingerprint identification module through the OLED display substrate. If the transmittance of the OLED display substrate is too low, the the information about the light reflected by the valley and ridge of the fingerprint is in a great loss, thereby adversely affecting precision of the fingerprint identification and sharpness of a fingerprint image.

In order to address the above issue, a display substrate, a fingerprint identification panel, a fingerprint identification method and a display device are provided according to embodiments of the present disclosure, for improving the transmittance of the display substrate, and improving the precision of the fingerprint identification.

A display substrate is provided according to at least one embodiment of the present disclosure, which includes a first metal pattern and a second metal pattern arranged on a base substrate and in different layers, and an orthographic projection of the first metal pattern on the base substrate at least partially overlaps with an orthographic projection of the second metal pattern on the base substrate.

In this embodiment, the first metal pattern and the second metal pattern are arranged in different layers, and the orthographic projection of the first metal pattern on the base substrate at least partially overlaps with the orthographic projection of the second metal pattern on the base substrate. That is, the first metal pattern and the second metal pattern are in a stacked structure. After multiple tape-out experiments, with such structure, there is no adverse effect on displaying, while the transmittance of the display substrate is improved. In a case that the display substrate is applied into the fingerprint identification panel, an intensity of the light received by the fingerprint identification module may become larger, thereby improving the precision of the fingerprint identification and increasing the image sharpness of the fingerprint identification.

In some optional embodiments, an extending direction of the first metal pattern is the same as that of the second metal pattern. Specifically, in some optional embodiments, the first metal pattern and the second metal pattern may extend in a row direction; or the first metal pattern and the second metal pattern may extend in a column direction.

In some optional embodiments, the orthographic projection of the first metal pattern on the base substrate falls within the orthographic projection of the second metal pattern on the base substrate. In this way, the light blocked by the first metal pattern and the second metal pattern may be decreased in full measure, which further improves the transmittance of the display substrate.

Specifically, the first metal pattern is a VDD signal line, and the second metal pattern is a data line; or the second metal pattern is the VDD signal line, and the first metal pattern is the data line. The VDD signal line is a supply voltage signal line configured to input a supply voltage to provide an operating voltage for the display substrate. In the related art, the VDD signal line and the data line are arranged in one layer and arranged side by side. In this way, a large amount of light is blocked by the VDD signal line and the data line, causing the transmittance of the display substrate to be merely about 2.5%. Based on such a structure of the display substrate in this embodiment, the transmittance of the display substrate may be improved to be about 3.6%, significantly increasing the image sharpness of the fingerprint identification.

In some optional embodiments, the display substrate is an OLED display substrate, and the OLED display substrate specifically includes:

a thin film transistor and a data line arranged on the base substrate, a source electrode of the thin film transistor being connected to the data line;

a passivation layer covering the thin film transistor and the data line, the thin film transistor and the data line being completely covered by the passivation layer, and the passivation layer including a via hole exposing an drain electrode of the thin film transistor;

the VDD signal line and a conductive connection line arranged on the passivation layer, the conductive connection line being connected to the drain electrode of the thin film transistor through the via hole penetrating the passivation layer;

a planarization layer covering the VDD signal line and the conductive connection line, the VDD signal line and the conductive connection line being completely covered by the planarization layer;

an anode arranged on the planarization layer, the anode being connected to the conductive connection line through a via hole penetrating the planarization layer;

a pixel defining layer arranged on the anode;

an organic light emitting layer arranged in a defined region of the pixel defining layer; and a cathode arranged on the organic light emitting layer.

Figure 2:
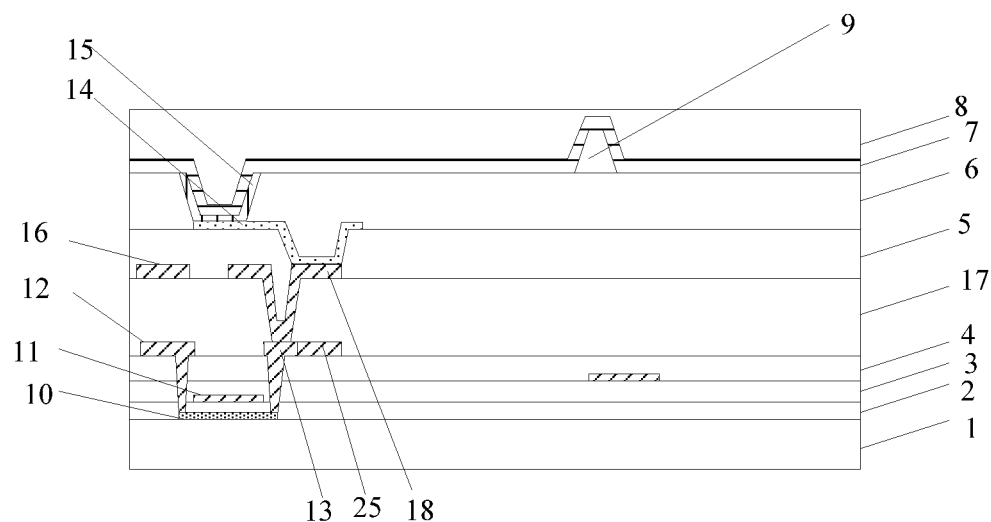
FIG. 2 is a schematic diagram of an OLED display substrate according to at least one embodiment of the present disclosure.

As shown in FIG. 2, the OLED display substrate according to the embodiment includes: a base substrate 1, an interlayer insulating layer 4, a planarization layer 5, a pixel defining layer 6, a thin film encapsulating layer 8, a spacer 9, a thin film transistor and a light emitting unit. The thin film transistor includes a gate electrode 11, a first gate insulating layer 2, a second gate insulating layer 3, an active layer 10, a source electrode 12, and a drain electrode 13. The light emitting unit includes an anode 14, an organic light emitting layer 15, and a cathode 7. The OLED display substrate further includes a VDD signal line 16. Different from the related art, the VDD signal line 16 is arranged in a layer different from those of the source electrode 12, the drain electrode 13 and the data line 25, an extending direction of the VDD signal line 16 is the same as that of the data line 25, and an orthographic projection of the VDD signal line 16 on the base substrate 1 at least partially overlaps with an orthographic projection of the data line 25 on the base substrate 1. That is, the VDD signal line 16 and the data line 25 are in a stacked structure. In this way, after multiple tape-out experiments, with such structure, there is not adverse effect on displaying, while the transmittance of the OLED display substrate is improved. In a case that the OLED display substrate is applied into the fingerprint identification panel, an intensity of the light received by the fingerprint identification module may become larger, thereby improving the precision of the fingerprint identification, and increasing the image sharpness of the fingerprint identification.

In some optional embodiments, the orthographic projection of the VDD signal line 16 on the base substrate 1 falls within the orthographic projection of the data line 25 on the base substrate 1, or an orthographic projection of the data line 25 on the base substrate 1 falls within an orthographic projection of the VDD signal line 16 on the base substrate 1. In this way, the transmittance of the OLED display substrate may be improved in full measure. Optionally, the orthographic projection of the data line 25 on the base substrate 1 may completely coincide with the orthographic projection of the VDD signal line 16 on the base substrate 1.

In order to ensure that the VDD signal line 16 is insulated from the source electrode 12, the drain electrode 13 and the data line 25, a passivation layer 17 is further provided between the VDD signal line 16 and the source electrode 12, the drain electrode 13 and the data line 25. However, the passivation layer 17 causes the drain electrode 13 to be incapable of being electrically connected to the anode 14. Accordingly, a conductive connection line 18 is required to be provided, which is connected to the drain electrode 13 and the anode 14, realizing the electrical connection between the drain electrode 13 and the anode 14.

In some optional embodiments, the conductive connection line 18 and the VDD signal line 16 are made of the same material, and thus the conductive connection line 18 and the VDD signal line 16 may be formed simultaneously by means of one patterning process, thereby decreasing the number of the patterning process of the display substrate, and reducing the cost of the display substrate.

Figure 3:
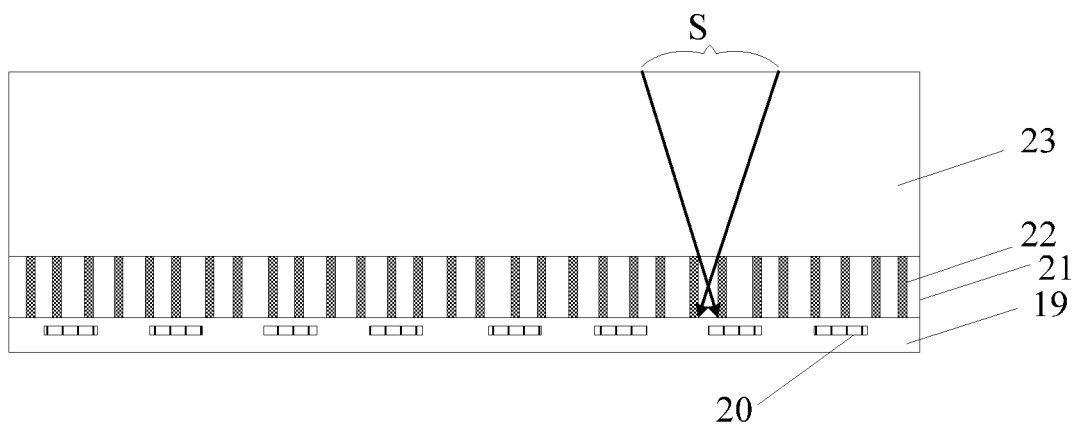
FIG. 3 is a schematic diagram of a fingerprint identification panel according to at least one embodiment of the present disclosure.

The light reflected by the fingerprint is irradiated on the fingerprint identification module mainly through light-transmitting regions of the display substrate, and an orthographic projection of each of the light-transmitting regions on the base substrate does not overlap with the orthographic projections of the metal patterns of the display substrate on the base substrate, that is, the light-transmitting regions are regions on the display substrate which are not blocked by the metal patterns. As shown in FIG. 3, the fingerprint identification module includes a collimating film 21 and photosensitive sensors 20, and the fingerprint identification module further includes a flexible substrate 19, and the photosensitive sensors 20 are arranged in an array on the flexible substrate 19. When information about the light reflected by the valley and ridge of the fingerprint is transmitted to the fingerprint identification module through the display substrate, the light information becomes mixed light information due to different optical paths. Therefore, the collimating film 21 is required to filter the scattered light in the light information, and directly collimate the light information emitted by the upper valley and ridge. The photosensitive sensors 20 collect the light of the valley and ridge of the fingerprint irradiated on the photosensitive sensors 20. Information about different light intensities sensed by the photosensitive sensors 20 is processed by a subsequent circuit, and the information about the fingerprint is collected.

The collimating film 21 includes a plurality of light-blocking walls 22 arranged in parallel, and a transparent material layer filled between the adjacent light-blocking walls 22. The light-blocking walls 22 may be made of a black matrix material or other black opaque resin materials, while a transparent material such as a resin is used as a transparent material layer filled between the light-blocking walls 22. During a process of bonding the collimating film 21 onto the display substrate, the collimating film 21 may be subjected to a pressure. If there is no transparent material layer filling between the adjacent light-blocking walls 22, the light-blocking walls 22 may topple down under pressure, resulting in a decrease in the transmittance of the collimating film 21 and a poor collimation effect. Therefore, the transparent material layer is required to fill between the adjacent light-blocking walls 22, which may reduce the risk of the light-blocking walls 22 toppling down and ensure a good fingerprint identification effect. Optionally, a height of the transparent material layer is greater than or equal to a height of the light-blocking wall 22, so that the risk of the light-blocking wall 22 toppling down may be avoided, and the good fingerprint identification effect is ensured.

In order to ensure a good collimation effect, a ratio of a distance d between the adjacent light-blocking walls 22 to a height h of the light-blocking wall 22 may be designed to be in a range from 1/10 to 1/7.

Figure 5:
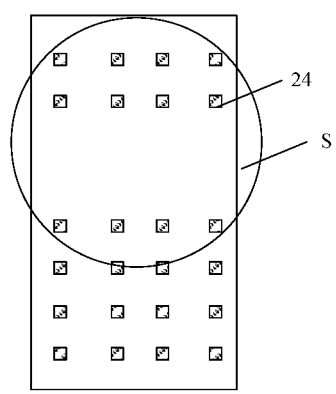
FIG. 5 and FIG. 6 each is a schematic diagram of uneven distribution of light-transmitting regions in the related art.
Figure 6:
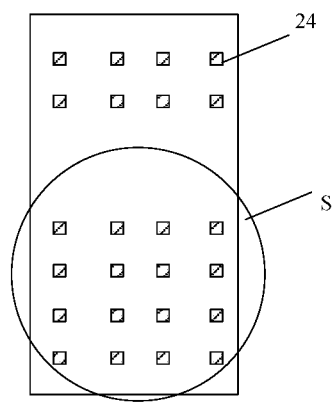

As shown in FIG. 3, a light-collecting angle of the collimating film 21 is S, that is, the light in the range S may reach the photosensitive sensor 20 through the collimating film 21, and ideally, the light-transmitting regions of the display substrate corresponding to the range S are distributed evenly, such that the energy of the light passing through each of the light-receiving angle ranges S is the same. In this case, the collimating film and the display substrate are not required to be aligned. As shown in FIG. 5 and FIG. 6, if the light-transmitting regions 24 on the display substrate are unevenly distributed, the transmittance of the display substrate may be unevenly distributed. If the fingerprint identification module is aligned at different positions on the display substrate, the received light intensities may be different. In a case that the position where the fingerprint identification module is aligned with the display substrate is as shown in FIG. 6, an intensity of the received light may be significantly greater than an intensity of the light received at the position where the fingerprint identification module is aligned with the display substrate as shown in FIG. 5. Therefore, in a case that the light-transmitting regions 24 on the display substrate are unevenly distributed, in order to ensure the good fingerprint imaging effect, the position where the transmittance is largest on the display substrate is required to be aligned with the light-passing center for the fingerprint identification module receiving light, which significantly increases the difficulty in manufacturing the fingerprint identification panel.

After calculation, if the light-transmitting regions 24 on the display substrate are unevenly distributed, the collimating film and the display substrate are not aligned, and the energy of the light passing through the maximum transmittance position and that passing through the minimum transmittance position are different by about 10%, thereby significantly increasing the difficulty in fingerprint identification.

Figure 7:
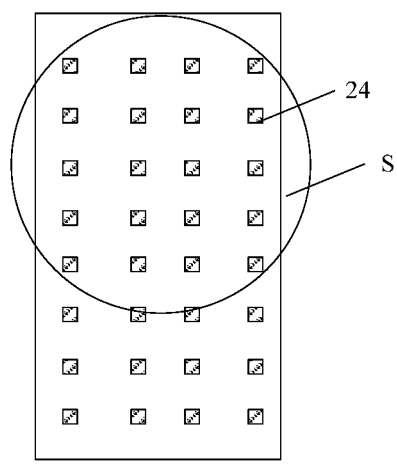
FIG. 7 and FIG. 8 each is a schematic diagram of even distribution of light-transmitting regions according to at least one embodiment of the present disclosure.
Figure 8:
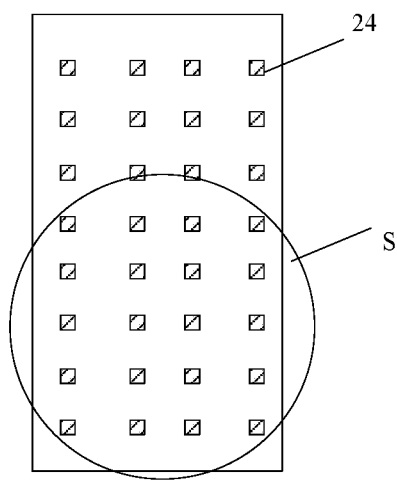

In this embodiment, the light-transmitting regions are regions on the display substrate which are not blocked by the first metal pattern and the second metal pattern. Since the first metal pattern and the second metal pattern are in the stacked structure, more regions may be spared to arrange the light-transmitting regions such that the light-transmitting regions are easy to be evenly distributed on the display substrate. The evenly distribution means that the number and the arrangement way of the light-transmitting regions are the same on per unit area. As shown in FIG. 7 and FIG. 8, in a case that the light-transmitting regions 24 are evenly distributed on the display substrate, no matter the position where the fingerprint identification module is aligned with the display substrate is as shown in FIG. 7 or FIG. 8, the light intensities received by the fingerprint identification module at different positions may be ensured to be basically the same, thereby avoiding the problem of alignment, reducing the difficulty in manufacturing the fingerprint identification panel, improving the productivity of the fingerprint identification panel, and lowing the cost of the fingerprint identification panel.

Figure 4:
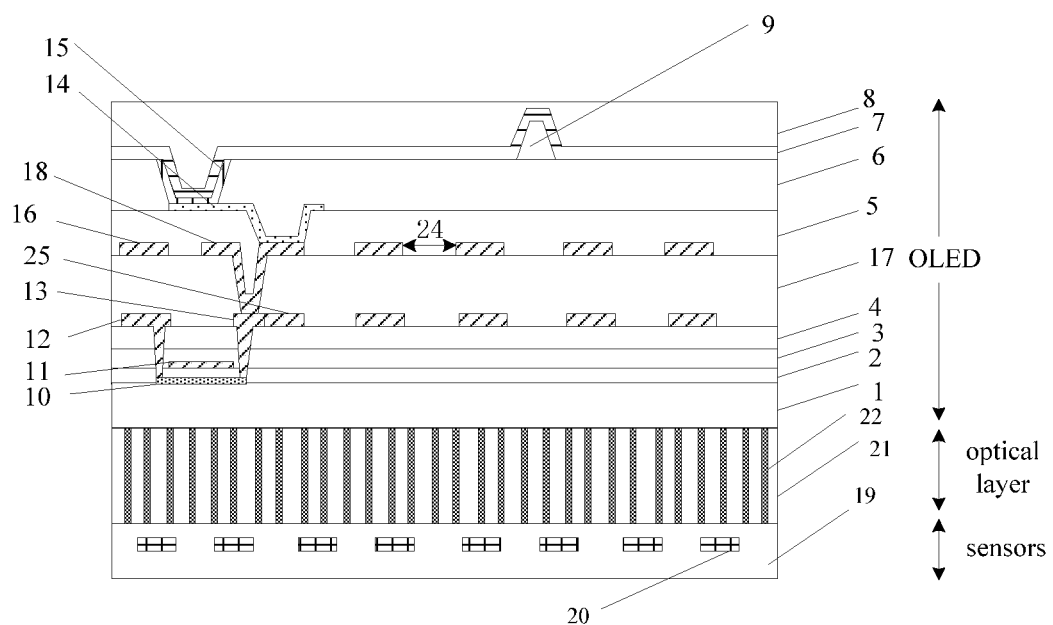
FIG. 4 is a schematic diagram of a fingerprint identification panel according to at least one embodiment of the present disclosure.

In some optional embodiments, as shown in FIG. 4, the VDD signal line 16 includes a plurality of VDD signal blocks having a same length and equally spaced, and regions between the adjacent VDD signal blocks are non-opaque, named as light-transmitting regions 24. Since the VDD signal blocks are equally spaced, the light-transmitting regions 24 are also equally spaced. Similarly, the data line 25 includes a plurality of data line blocks equally spaced, and regions between the adjacent data line blocks are non-opaque, also named as light-transmitting regions 24. As shown in FIG. 4, the plurality of data line blocks is equally spaced. With such structure, the light-transmitting regions 24 are evenly distributed on the display substrate and arranged periodically, the intensities of the light received by the fingerprint identification module at different positions may be ensured to be substantially the same, thereby avoiding the problem of alignment, reducing the difficulty in manufacturing the fingerprint identification panel, improving the productivity of the fingerprint identification panel, and lowing the cost of the fingerprint identification panel. The light-transmitting regions may be periodically arranged in one pixel unit, or may also be periodically arranged in a plurality of pixel units. The pixel design may be performed according to actual requirements, which is not limited in the embodiments of the present disclosure.

A fingerprint identification panel is further provided according to at least one embodiment of the present disclosure, which includes the display substrate described above and a fingerprint identification module arranged on a non-display side of the display substrate.

In this embodiment, the first metal pattern and the second metal pattern are arranged in different layers, and the orthographic projection of the first metal pattern on the base substrate at least partially overlaps with the orthographic projection of the second metal pattern on the base substrate. That is, the first metal pattern and the second metal pattern are in a stacked structure. After multiple tape-out experiments, with such structure, there is no adverse effect on displaying, while the transmittance of the display substrate is improved. In a case that the display substrate is applied into the fingerprint identification panel, the light intensity received by the fingerprint identification module may become larger, thereby improving the precision of the fingerprint identification, and increasing the image sharpness of the fingerprint identification.

In some optional embodiments, the fingerprint identification module includes a collimating film and photosensitive sensors, the collimating film is configured for transmitting the collimated light reflected by the fingerprint and blocking the scattered light, and the photosensitive sensors are configured for receiving the collimated light transmitted through the collimating film and identifying the fingerprint according to the collimated light.

In a particular embodiment, as shown in FIG. 3, the fingerprint identification panel includes an OLED display module 23 and a fingerprint identification module. The fingerprint identification module includes a collimating film 21 and photosensitive sensors 20, the fingerprint identification module further includes a flexible substrate 19, and the photosensitive sensors 20 are arranged in an array on the flexible substrate 19. When the light information reflected by the valley and ridge of the fingerprint is transmitted to the fingerprint identification module through the display substrate, the light information becomes mixed light information due to different optical paths. Therefore, the collimating film 21 is required to filter the scattered light in the light information, and directly collimate the light information reflected by the upper valley and ridge. The photosensitive sensors 20 collect the light of the valley and ridge of the fingerprint irradiated on the photosensitive sensors 20. Different light intensity information sensed by the photosensitive sensors 20 is processed by a subsequent circuit, and the information about the fingerprint is collected.

The collimating film 21 includes a plurality of light-blocking walls 22 arranged in parallel, and a transparent material layer filled between the adjacent light-blocking walls 22. The light-blocking walls 22 may be made of a black matrix material or other black opaque resin materials, while a transparent material such as a resin is used as a transparent material layer filled between the light-blocking walls 22. During a process of bonding the collimating film 21 onto the display substrate, the collimating film 21 may be subjected to a pressure. If there is no transparent material layer filling between the adjacent light-blocking walls 22, the light-blocking walls 22 may topple down under pressure, resulting in a decrease in the transmittance of the collimating film 21 and a poor collimation effect. Therefore, the transparent material layer is required to fill between the adjacent light-blocking walls 22, which may reduce the risk of the light-blocking walls 22 toppling down and ensure a good fingerprint identification effect. Optionally, the height of the transparent material layer is greater than or equal to the height of the light-blocking wall 22, so that the risk of the light-blocking wall 22 toppling down may be avoided, and the good fingerprint identification effect is ensured.

In order to ensure the good collimation effect, a ratio of the distance d between the adjacent light-blocking walls 22 to the height h of the light-blocking wall 22 may be designed to be in a range from 1/10 to 1/7.

In some optional embodiments, in a case that the display substrate is a flexible display substrate, the collimating film is reused as the base substrate of the display substrate. In an aspect, the collimating film may play a supporting role to ensure a shape of the flexible display substrate not to be changed. In another aspect, with the collimating film reused as the base substrate of the display substrate, a thickness of the fingerprint identification panel is reduced, and thereby reducing an optical path of the fingerprint valley and ridge reflection, and minimizing an information loss of the light reflected by the valley and ridge to enable the light intensity received by the photosensitive sensors to become larger. In such a manner, the precision of fingerprint identification is improved.

A fingerprint identification method is further provided according to at least one embodiment of the present disclosure, which is applied to the fingerprint identification panel described above. The fingerprint identification method includes:

receiving, by the fingerprint identification module, light that is transmitted through the display substrate and then is reflected by a fingerprint; and identifying, by the fingerprint identification module, the fingerprint according to the received light.

In this embodiment, the first metal pattern and the second metal pattern are arranged in different layers, and the orthographic projection of the first metal pattern on the base substrate at least partially overlaps with the orthographic projection of the second metal pattern on the base substrate. That is, the first metal pattern and the second metal pattern are in a stacked structure. After multiple tape-out experiments, with such structure, there is no adverse effect on displaying, while the transmittance of the display substrate is improved. In a case that the display substrate is applied into the fingerprint identification panel, the light intensity received by the fingerprint identification module may become larger, thereby improving the precision of the fingerprint identification, and increasing the image sharpness of the fingerprint identification.

In some optional embodiments, the display substrate includes a plurality of light-transmitting regions, and an orthographic projection of each of the light-transmitting regions on the base substrate does not overlap with the orthographic projections of metal patterns of the display substrate on the base substrate. In a case that the fingerprint identification module includes a collimating film and photosensitive sensors, the fingerprint identification method specifically includes:

reflecting by the finger fingerprint the light irradiated onto the fingerprint, and transmitting the reflected light to the collimating film through the light-transmitting region;

the collimating film transmitting the collimated light in the reflected light and blocking scattered light in the reflected light; and the photosensitive sensors receiving the collimated light, and identifying the fingerprint according to the collimated light.

The light reflected by the fingerprint is irradiated on the fingerprint identification module mainly through light-transmitting regions. If the light-transmitting regions are unevenly distributed, the transmittance of the display substrate may be unevenly distributed, which adversely affects the fingerprint imaging effect. The position where the transmittance is largest on the display substrate is required to be aligned with the light-passing center for the fingerprint identification module receiving light, which significantly increases the difficulty in manufacturing the fingerprint identification panel. In this embodiment, the plurality of light-transmitting regions is evenly distributed on the display substrate such that the transmittance of the display substrate is evenly distributed, thereby avoiding the problem of alignment, reducing the difficulty in manufacturing the fingerprint identification panel, improving the productivity of the fingerprint identification panel, and lowing the cost of the fingerprint identification panel.

A display device is further provided according to at least one embodiment of the present disclosure, which includes the fingerprint identification panel described above. The display device may be any product or component having a display function, such as a television, a display, a digital photo frame, a mobile phone, or a tablet computer, and the display device further includes a flexible circuit board, a printed circuit board, and a backboard.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", "includes", "include", "comprise", "comprises" or "comprising" and the like mean that an element or an article preceding the term contains elements or items and equivalents thereof behind the term, but does not exclude other elements or items. Such terms as "connect", "connected" or "connecting" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A display substrate, comprising: a first metal pattern and a second metal pattern arranged on a base substrate and in different layers, wherein
the second metal pattern is a supply voltage signal line, and the first metal pattern is a data line; and
an orthographic projection of all the data line of the display substrate onto the base substrate completely falls within an orthographic projection of the supply voltage signal line onto the base substrate,
wherein the display substrate further comprises:
a thin film transistor and the data line arranged on the base substrate, a source electrode of the thin film transistor being connected to the data line;
a passivation layer covering the thin film transistor and the data line; and
the supply voltage signal line and a conductive connection line arranged on the passivation layer, the conductive connection line being connected to a drain electrode of the thin film transistor through a first via hole penetrating the passivation layer;
wherein the display substrate is an OLED display substrate, and the OLED display substrate further comprises:
a planarization layer covering the supply voltage signal line and the conductive connection line;
an anode arranged on the planarization layer, the anode being connected to the conductive connection line through a second via hole penetrating the planarization layer;
a pixel defining layer arranged on the anode;
an organic light emitting layer arranged in a defined region of the pixel defining layer; and
a cathode arranged on the organic light emitting layer, wherein the anode and the cathode each is made of a light-transmitting material;
wherein the conductive connection line and the supply voltage signal line are made of a same material and formed in a single patterning process;
wherein the second metal pattern comprises a plurality of second metal blocks having a same length, and the plurality of second metal blocks are arranged at equal intervals on the base substrate, and a light-transmitting region is formed between every two adjacent of the plurality of second metal blocks.

2. The display substrate according to claim 1, wherein an extending direction of the first metal pattern is the same as that of the second metal pattern.

3. The display substrate according to claim 2, wherein the first metal pattern and the second metal pattern extend in a row direction; or the first metal pattern and the second metal pattern extend in a column direction.

4. The display substrate according to claim 1, wherein the first metal pattern comprises a plurality of first metal blocks having a same length, the plurality of first metal blocks is arranged at equal intervals on the base substrate, and a light transmitting region is formed between every two adjacent of the plurality of first metal blocks.

5. A fingerprint identification panel, comprising: a display substrate and a fingerprint identification module arranged on a non-display side of the display substrate, wherein
the display substrate comprises a first metal pattern and a second metal pattern arranged on a base substrate and in different layers, the second metal pattern is a supply voltage signal line, and the first metal pattern is a data line; and
an orthographic projection of all the data line of the display substrate onto the base substrate completely falls within an orthographic projection of the supply voltage signal line onto the base substrate,
wherein the display substrate further comprises:
a thin film transistor and the data line arranged on the base substrate, a source electrode of the thin film transistor being connected to the data line;
a passivation layer covering the thin film transistor and the data line; and
the supply voltage signal line and a conductive connection line arranged on the passivation layer, the conductive connection line being connected to a drain electrode of the thin film transistor through a first via hole penetrating the passivation layer;
wherein the display substrate is an OLED display substrate, and the OLED display substrate further comprises:
a planarization layer covering the supply voltage signal line and the conductive connection line;
an anode arranged on the planarization layer, the anode being connected to the conductive connection line through a second via hole penetrating the planarization layer;
a pixel defining layer arranged on the anode;
an organic light emitting layer arranged in a defined region of the pixel defining layer; and
a cathode arranged on the organic light emitting layer, wherein the anode and the cathode each is made of a light-transmitting material;
wherein the conductive connection line and the supply voltage signal line are made of a same material and formed in a single patterning process;
wherein the second metal pattern comprises a plurality of second metal blocks having a same length, and the plurality of second metal blocks are arranged at equal intervals on the base substrate, and a light-transmitting region is formed between every two adjacent of the plurality of second metal blocks.

6. The fingerprint identification panel according to claim 5, wherein
the fingerprint identification module comprises a collimating film and photosensitive sensors, the collimating film is configured to transmit light reflected by a fingerprint and filter out scattered light in the reflected light to cause the transmitted light through the collimating film to become the collimated light, and each of the photosensitive sensors is configured to receive the collimated light transmitted through the collimating film and identify the fingerprint according to the collimated light.

7. The fingerprint identification panel according to claim 6, wherein the display substrate is a flexible display substrate, and the collimating film is used as the base substrate of the display substrate.

8. The fingerprint identification panel according to claim 6, wherein the collimating film comprises a plurality of vertical light-blocking walls equally spaced, and a transparent material layer filling between every two adjacent of the light-blocking walls.

9. A fingerprint identification method, for the fingerprint identification panel according to claim 5, wherein the method comprises:
    receiving, by the fingerprint identification module, light that is transmitted through the display substrate and then is reflected by a fingerprint; and
    identifying, by the fingerprint identification module, the fingerprint according to the received light.

10. The fingerprint identification method according to claim 9, wherein the fingerprint identification module comprises a collimating film and photosensitive sensors, the collimating film is configured to transmit light reflected by the fingerprint and filter out scattered light in the reflected light to cause the transmitted light through the collimating film to become the collimated light, and each of the photosensitive sensors is configured to receive the collimated light transmitted through the collimating film and identify the fingerprint according to the collimated light; and
    wherein the receiving, by the fingerprint identification module, light reflected by a fingerprint comprises:
        enabling the light reflected by the fingerprint to transmit through the collimating film to become the collimated light, and receiving, by the photosensitive sensors, the collimated light transmitted through the collimating film.

11. A display device, comprising: the fingerprint identification panel according to claim 5.

* * * * *